US010516102B1

(12) United States Patent
Yang et al.

(10) Patent No.: US 10,516,102 B1
(45) Date of Patent: Dec. 24, 2019

(54) MULTIPLE SPACER ASSISTED PHYSICAL ETCHING OF SUB 60NM MRAM DEVICES

(71) Applicant: Taiwan Semiconductor Manufacturing Company, Ltd., Hsinchu (TW)

(72) Inventors: Yi Yang, Fremont, CA (US); Dongna Shen, San Jose, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/161,139

(22) Filed: Oct. 16, 2018

(51) Int. Cl.

| | |
|---|---|
| ***H01L 43/12*** | (2006.01) |
| ***H01L 43/10*** | (2006.01) |
| ***H01L 27/22*** | (2006.01) |
| ***H01L 43/02*** | (2006.01) |
| ***H01L 43/08*** | (2006.01) |

(52) U.S. Cl.
CPC ............ *H01L 43/12* (2013.01); *H01L 27/222* (2013.01); *H01L 43/02* (2013.01); *H01L 43/08* (2013.01); *H01L 43/10* (2013.01)

(58) Field of Classification Search
CPC ......... H01L 43/12; H01L 43/02; H01L 43/08; H01L 27/222
See application file for complete search history.

(56) References Cited

U.S. PATENT DOCUMENTS

| | | | | |
|---|---|---|---|---|
| 8,642,358 | B2 | 2/2014 | Lee | |
| 8,883,520 | B2 | 11/2014 | Satoh et al. | |
| 9,269,893 | B2 | 2/2016 | Lu et al. | |
| 9,269,894 | B2 * | 2/2016 | Mudivarthi | H01L 43/12 |
| 9,450,180 | B1 * | 9/2016 | Annunziata | H01L 43/12 |
| 9,559,294 | B2 * | 1/2017 | Hsu | H01L 43/08 |
| 9,559,298 | B2 * | 1/2017 | Ha | H01L 45/06 |
| 9,570,670 | B2 | 2/2017 | Park et al. | |
| 9,722,174 | B1 | 8/2017 | Nagel et al. | |
| 9,793,126 | B2 | 10/2017 | Dhindsa et al. | |
| 10,367,139 | B2 * | 7/2019 | Boone | H01L 43/12 |
| 2016/0359101 | A1 * | 12/2016 | Kuo | H01L 43/02 |
| 2017/0084828 | A1 * | 3/2017 | Hsu | H01L 43/12 |
| 2017/0125663 | A1 * | 5/2017 | Nagel | H01L 43/12 |
| 2018/0366638 | A1 * | 12/2018 | Lin | H01L 43/08 |
| 2019/0207083 | A1 * | 7/2019 | Zhong | H01L 27/222 |

* cited by examiner

*Primary Examiner* — William Coleman
(74) *Attorney, Agent, or Firm* — Haynes and Boone, LLP

(57) ABSTRACT

A MTJ stack is deposited on a bottom electrode. A top electrode layer and hard mask are deposited on the MTJ stack. The top electrode layer not covered by the hard mask is etched. Thereafter, a first spacer layer is deposited over the patterned top electrode layer and the hard mask. The first spacer layer is etched away on horizontal surfaces leaving first spacers on sidewalls of the patterned top electrode layer. The free layer not covered by the hard mask and first spacers is etched. Thereafter, the steps of depositing a subsequent spacer layer over patterned previous layers, etching away the subsequent spacer layer on horizontal surfaces leaving subsequent spacers on sidewalls of the patterned previous layers, and thereafter etching a next layer not covered by the hard mask and subsequent spacers are repeated until all layers of the MTJ stack have been etched to complete the MTJ structure.

18 Claims, 2 Drawing Sheets

20 22 28 26 31 30 36 18 34 32 16 40 38 14 d10 12 10 d9

MULTIPLE SPACER ASSISTED PHYSICAL ETCHING OF SUB 60NM MRAM DEVICES

TECHNICAL FIELD

This application relates to the general field of magnetic tunneling junctions (MTJ) and, more particularly, to etching methods for forming MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE) or their combination are usually involved. During RIE, high energy ions remove materials vertically in those areas not masked by photoresist, separating one MTJ cell from another.

However, the high energy ions can also react with the non-removed materials, oxygen, moisture and other chemicals laterally, causing sidewall damage and lowering device performance. To solve this issue, pure physical etching techniques such as RIE or ion beam etching (IBE) using different gas plasmas such as Ar and Xe have been applied to etch the MTJ stack. However, due to the non-volatile nature, physically etched conductive materials in the MTJ and bottom electrode can form a continuous path across the tunnel barrier, resulting in shorted devices. Moreover during physical etch of MTJ, one layer can be re-deposited and intermixed with the surrounding layers, lowering the device performance. A new approach to overcome these drawbacks is thus needed for the future sub 60 nm MRAM products.

Several references teach multi-step etching methods to form MTJ's, including U.S. Pat. Nos. 9,793,126 (Dhindsa et al), 9,722,174 (Nagel et al), 8,883,520 (Satoh et al), and 9,269,893 (Lu et al). U.S. Pat. Nos. 9,570,670 (Park et al) and 8,642,358 (Lee) teach etching using spacers. All of these references are different from the present disclosure.

SUMMARY

It is an object of the present disclosure to provide an improved method of forming MTJ structures.

Yet another object of the present disclosure is to provide a method of forming MTJ devices without shorting the tunnel barrier by metal re-deposition on the MTJ sidewall or intermixing one MTJ layer with another.

In accordance with the objectives of the present disclosure, a method for etching a magnetic tunneling junction (MTJ) structure is achieved. A MTJ stack is deposited on a bottom electrode wherein the MTJ stack comprises at least a second pinned layer, a first pinned layer on the second pinned layer, a barrier layer on the first pinned layer, and a free layer on the barrier layer. A top electrode layer is deposited on the MTJ stack. A hard mask is deposited on the top electrode layer. The top electrode layer not covered by the hard mask is etched. Thereafter, a first spacer layer is deposited over the patterned top electrode layer and the hard mask. The first spacer layer is etched away on horizontal surfaces leaving first spacers on sidewalls of the patterned top electrode layer. The free layer not covered by the hard mask and first spacers is etched. Thereafter, the steps of depositing a subsequent spacer layer over patterned previous layers and the hard mask and etching away the subsequent spacer layer on horizontal surfaces leaving subsequent spacers on sidewalls of the patterned previous layers, and thereafter etching a next layer not covered by the hard mask and subsequent spacers are repeated until all layers of the MTJ stack have been etched to complete the MTJ structure.

BRIEF DESCRIPTION OF THE DRAWINGS

In the accompanying drawings forming a material part of this description, there is shown.

DETAILED DESCRIPTION

In the process of the present disclosure, the MTJ patterning is divided into different steps. Each step consists of a physical etch of one MTJ layer, spacer deposition, spacer partial etch, and physical etch of the next layer using the remaining spacer as a hard mask. Due to the protection of the spacer, any metal re-deposition cannot be in contact with the surrounding layers, avoiding a conductive path on the tunnel barrier and intermixing of different MTJ layers. As a result, any electrical shorts or device performance degradation associated with these issues are eliminated. This will unleash the full potential of this type of etch, which has been considered to cause less damage but has been limited by these drawbacks. This method is particularly useful for high density sub 60 nm MRAM devices, where chemical damage and re-deposition on the MTJ sidewall becomes very severe for the smaller sized MRAM chips.

In a typical MTJ process, the whole MTJ stack is patterned by a single step etch, either by chemical RIE or physical Ar RIE or IBE. It therefore creates either chemical damage or physical shorts/intermixing on the MTJ sidewall. In the process of the present disclosure, we firstly etch one MTJ layer by a physical etch, cover its sidewall with a spacer, and then etch the next layer again by a physical etch using the spacer as a hard mask. By repeating these procedures for each layer, the MTJ stack can be patterned without those issues.

Figure 1:
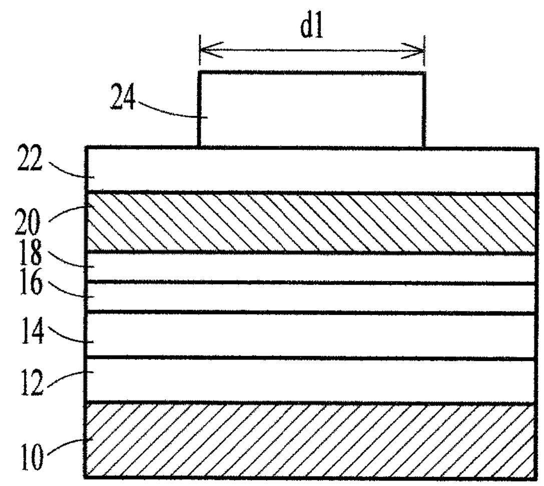
FIGS. 1 through 8 illustrate in cross-sectional representation steps in a preferred embodiment of the present disclosure.

Referring now to FIGS. 1 through 8, the novel method of the present disclosure will be described in detail. Referring now more particularly to FIG. 1, there is shown a bottom electrode 10 formed on a substrate, not shown. Now, layers are deposited on the bottom electrode to form a magnetic tunnel junction. For example, pinned layer-2 12, pinned layer-1 14, tunnel barrier layer 16, and free layer 18 are deposited.

There may be one or more pinned, barrier, and/or free layers. A metal hard mask 20, such as Ta, TaN, Ti, TiN, W, Cu, Mg, Ru, Cr, Co, Fe, Ni or their alloys, is deposited to a thickness of 10-100 nm, and preferably ≥50 nm, on top of the MTJ stack. This hard mask will be used as a top electrode. Finally, a dielectric hard mask material 22, such as $SiO_2$, SiN, SiON, SiC or SiCN, is deposited to a thickness of ≥20 nm onto the top electrode 20. Photoresist is patterned by 248 nm photolithography, for example, to form photoresist pillar patterns 24 with size d1 of ~70-80 nm and height ≥200 nm.

Figure 2:
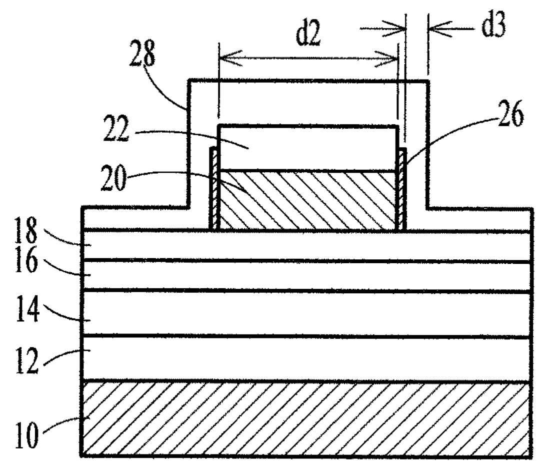

Now, as illustrated in FIG. 2, the dielectric hard mask 22 is etched by a fluorine carbon based plasma such as $CF_4$ or $CHF_3$ alone, or mixed with Ar and $N_2$. $O_2$ can be added to reduce the pillar size from 50-60 nm to 30-40 nm. Next, the top electrode 20 is etched by Ar or Xe RIE or IBE, forming pillar size d2 of 30-40 nm. Because of the nature of physical etching, there is no chemical damage but only a thin layer of conductive metal re-deposition 26 on the dielectric and metal hard masks' sidewalls.

A spacer 28 made of dielectric materials which have low ion sputter yield such as SiN, carbon, TaC or metal oxide is either in-situ or ex-situ deposited by chemical vapor deposition (CVD), physical vapor deposition (PVD) or atomic layer deposition (ALD) onto the patterned metal and dielectric hard masks with a thickness d3 of 5-30 nm.

Figure 3:
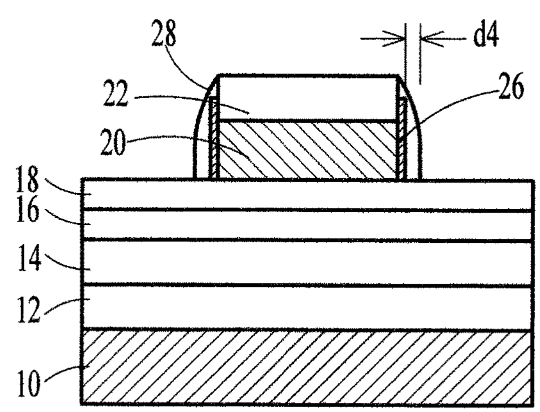

Next, as shown in FIG. 3, the portion of the spacer 28 on horizontal surfaces is etched away by RIE, leaving the spacer 28 only on the sidewalls. Depending on the material used for the spacer, different plasmas can be used for this step. For example, if the spacer is carbon, $O_2$ plasma can be applied. For TaC or SiN, a fluorine carbon such as $CF_4$ or a halogen such as $Cl_2$ can be used. For metal oxide, a halogen such as $Cl_2$ alone or mixed with $BCl_3$ can be used.

Figure 4:
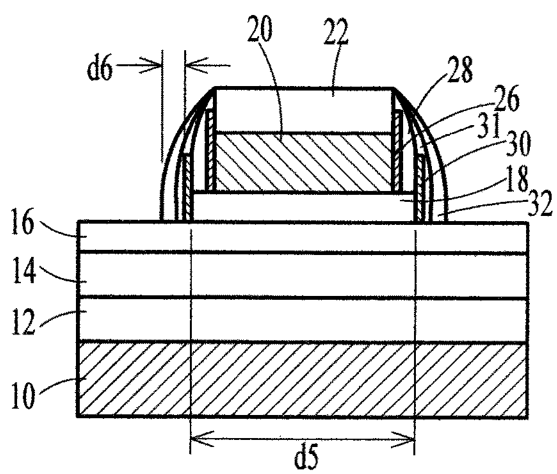

Now, as shown in FIG. 4, using the spacer 28 left on the metal hard mask sidewall as a self-aligned hard mask, the free layer is etched by a physical etch such as Ar or Xe RIE or IBE. Under the same physical etch condition, this spacer's etch rate is ≤⅕ of the free layer or any later etch layers. By doing this, again one can avoid chemical damage but only generate a thin layer of conductive metal re-deposition 30 on the spacer surrounding the metal hard mask's sidewall. More importantly, the free layer etch generated re-deposition 30 is not in contact with the metal hard mask 20 or its re-deposition 26 due to the spacer's (28) separation.

An encapsulation layer 31 made of $Al_2O_3$, SiON or SiN with thickness d6 of 5-30 nm is either in-situ or ex-situ deposited by CVD, PVD or ALD to protect the free layer. This encapsulation layer is necessary because the free layer is especially sensitive to oxygen, moisture, and other chemicals especially during high temperature processing. The encapsulation layer is required only on the free layer, not on subsequent layers.

Next, a subsequent spacer layer 32 is deposited over the encapsulation layer 31. The spacer layer materials can be different or the same as the encapsulation layer, depending on what material is used. For example, if SiN is used as the encapsulation layer, the encapsulation layer can act as both encapsulation layer and subsequent spacer layer 32. Other materials may not do so. The encapsulation layer 31 and spacer layer 32 are both etched to remove material on horizontal surfaces and leave the encapsulation layer and spacer layer only on sidewalls as shown in FIG. 4.

By repeating the spacer deposition, spacer partial etch and physical etch steps for the following tunnel barrier, pinned layer-1 and pinned layer-2, one can step by step define the MTJ without connecting each step's generated metal re-deposition as well as avoiding intermixing one layer with another. This is shown in the remaining figures.

Figure 5:
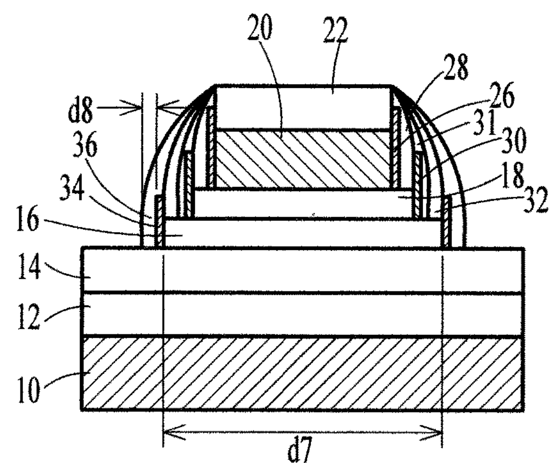

FIG. 5 shows partially etched spacer 32 used to etch the tunnel barrier layer 16 and metal re-deposition 34 on the tunnel barrier sidewall separated from the previous re-deposition 30 by spacer 32. Then spacer material 36 is deposited and partially etched to form spacers 36 having a thickness d8 of 5-30 nm.

Figure 6:
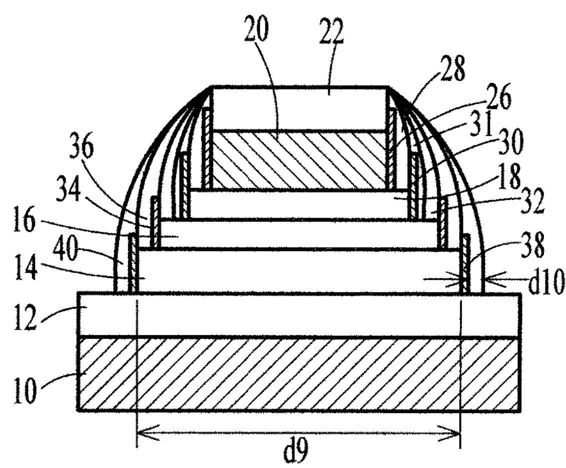

FIG. 6 shows partially etched spacer 36 used to etch the first pinned layer 14 and metal re-deposition 38 on the first pinned layer sidewall separated from the previous re-deposition 34 by spacer 36. Spacer material is deposited and partially etched to form spacers 40 having a thickness d10 of 5-30 nm.

Figure 7:
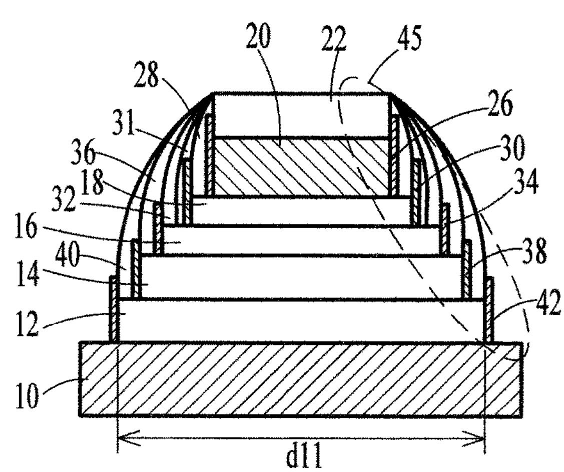

FIG. 7 shows partially etched spacer 40 used to etch the second pinned layer 12 and metal re-deposition 42 on the second pinned layer sidewall separated from the previous re-deposition 38 by spacer 40. The circle 45 in FIG. 7 shows the metal sidewall re-deposition materials 26, 20, 24, 28, and 42, all separated from one another by dielectric so that there is no possibility of shorting.

Each layer's size is greatly dependent on the thickness of the spacer sidewall serving as the hard mask, which is determined by the earlier spacer deposition thickness and partial etch conditions. By tuning these parameters, one can precisely control each layer's size according to the device design. We can create a thick spacer of 10-30 nm on the free layer's sidewall so that the later defined tunnel barrier and pinned layers have a size d7, d9, d11 of 50-60 nm, larger than the free layer size d5 of 40-50 nm. This is particularly critical for small cell size devices since it allows for strong pinning strength, increasing the energy barrier, and reducing the switching current. For the pinned layer etch, one can use a very thin spacer (5-10 nm) on pinned layer-13 s sidewall to define pinned layer-2, thanks to the spacer's ultra-low consumption rate under physical etch. This would ensure that these two pinned layers are not intermixed during physical etch but still have similar size, stabilizing their pinning strength.

Figure 8:
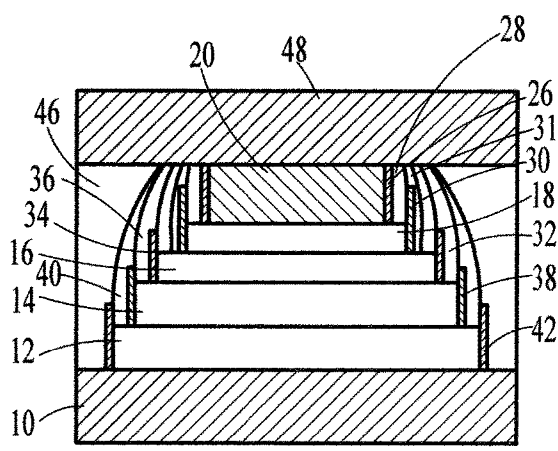

Finally, as illustrated in FIG. 8, the whole device can be filled with dielectric 46 and flattened by chemical mechanical polishing (CMP), for example, to expose the top electrode 20 underneath, finishing the whole MTJ fabrication with metal connection layer 48.

The completed MTJ structure in FIG. 8 comprises a least a pinned layer 12/14 on a bottom electrode 10, a barrier layer 16 and first sidewall spacers 36 on the pinned layer 12/14, a free layer 18 and second sidewall spacers 32 on the barrier layer, a metal hard mask 20 and third sidewall spacers 28 on the free layer, and a top electrode 48 over the free layer. Any first metal re-deposition 42/38 on sidewalls of the pinned layer is separated from any second metal re-deposition 34 on sidewalls of said barrier layer by the first sidewall spacers 36, the second metal re-deposition 34 is separated from any third metal re-deposition 30 on sidewalls of the free layer by the second sidewall spacers 32, and the third metal re-deposition 30 is separated from any fourth metal re-deposition 26 on sidewalls of the metal hard mask layer by the third sidewall spacers 28.

In summary, the process of the present disclosure employs spacers to prevent physical etch induced metal re-deposition on the tunnel barrier and MTJ intermixing. It thus solves the largest issue associated with this type of etch. It is thus possible to replace the widely used chemical RIE etch, which inevitably brings chemical damage on the MTJ sidewall. This process will be used for MRAM chips of the size smaller than 60 nm as problems associated with chemically damaged sidewalls and re-deposition from the MTJ stack and bottom electrode become very severe for the smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for fabricating a magnetic tunneling junction (MTJ) structure comprising:

depositing a MTJ stack on a bottom electrode wherein said MTJ stack comprises at least a pinned layer on said bottom electrode, a barrier layer on said pinned layer, and a free layer on said barrier layer;

depositing a top electrode layer on said MTJ stack;

forming a hard mask on said top electrode layer;

first etching said top electrode layer not covered by said hard mask;

thereafter depositing a first spacer layer over patterned said top electrode layer and said hard mask and etching away said first spacer layer on horizontal surfaces leaving first spacers on sidewalls of patterned top electrode layer;

thereafter second etching said free layer not covered by said hard mask and said first spacers; and thereafter repeating steps of depositing a subsequent spacer layer over patterned previous layers and said hard mask and etching away said subsequent spacer layer on horizontal surfaces leaving subsequent spacers on sidewalls of said patterned previous layers and thereafter third etching a next layer not covered by said hard mask and said subsequent spacers until all layers of said MTJ stack have been etched to complete said MTJ structure.

2. The method according to claim 1 wherein said top electrode layer comprises Ta, TaN, Ti, TiN, W, Cu, Mg, Ru, Cr, Co, Fe, Ni or their alloys and said hard mask comprises $SiO_2$, SiN, SiON, SiC or SiCN wherein said hard mask is etched by a fluorine carbon based plasma prior to said first etching said top electrode layer.

3. The method according to claim 1 further comprising:

depositing an encapsulation layer on said free layer prior to said depositing a subsequent spacer layer on said free layer, wherein said encapsulation layer comprises $Al_2O_3$, SiON or SiN with a thickness of 5-30 nm, and etching away said subsequent spacer layer and said encapsulation layer on horizontal surfaces leaving subsequent spacers on sidewalls of said free layer.

4. The method according to claim 1 wherein said first, second, and third etching comprise a Ar or Xe RIE or IBE etching.

5. The method according to claim 1 wherein there is no chemical damage to sidewalls of said MTJ stack and wherein after said first etching, a first layer of conductive metal re-deposition is formed on said sidewalls of said top electrode.

6. The method according to claim 1 wherein said depositing said first or subsequent spacer layer comprises depositing a dielectric material having low ion sputter yield comprising SiN, carbon, TaC, or metal oxide in-situ or ex-situ by chemical vapor deposition (CVD), physical vapor deposition (PVD), or atomic layer deposition (ALD) to a thickness of 5-30 nm.

7. The method according to claim 1 wherein an etch rate of said spacers is ≤⅕ an etch rate of said free layer or any of said next layers.

8. The method according to claim 1 further comprising:

covering said MTJ structure with a dielectric layer;

flattening said dielectric layer by chemical mechanical polishing (CMP) to expose said top electrode layer; and forming a top metal contact to said top electrode layer.

9. The method according to claim 5 wherein there is no chemical damage to sidewalls of said MTJ stack and wherein after each said second and third etching, a subsequent layer of conductive metal re-deposition is formed on said first or subsequent spacers and wherein there is no contact between any of said first layer of conductive metal re-deposition and said subsequent layers of conductive metal re-deposition as they are separated by said first and said subsequent spacers.

10. A method for fabricating a magnetic tunneling junction (MTJ) structure comprising:

depositing a MTJ stack on a bottom electrode wherein said MTJ stack comprises at least a second pinned layer, a first pinned layer on said second pinned layer, a barrier layer on said first pinned layer, and a free layer on said barrier layer;

depositing a top electrode layer on said MTJ stack.

forming a hard mask on said top electrode layer;

first etching said top electrode layer not covered by said hard mask;

thereafter depositing a first spacer layer over patterned said top electrode layer and said hard mask and etching away said first spacer layer on horizontal surfaces leaving first spacers on sidewalls of patterned top electrode layer;

thereafter second etching said free layer not covered by said hard mask and said first spacers;

thereafter depositing an encapsulation layer over said free layer; and thereafter repeating steps of depositing a subsequent spacer layer over patterned previous layers and said hard mask and etching away said subsequent spacer layer on horizontal surfaces leaving subsequent spacers on sidewalls of said patterned previous layers and thereafter third etching a next layer not covered by said hard mask and said subsequent spacers until all layers of said MTJ stack have been etched to complete said MTJ structure.

11. The method according to claim 10 wherein said top electrode layer comprises Ta, TaN, Ti, TiN, W, Cu, Mg, Ru, Cr, Co, Fe, Ni or their alloys and said hard mask comprises $SiO_2$, SiN, SiON, SiC or SiCN wherein said hard mask is etched by a fluorine carbon based plasma prior to said first etching said top electrode layer.

12. The method according to claim 10 wherein said first, second, and third etching comprise a Ar or Xe RIE or IBE etching.

13. The method according to claim 10 wherein there is no chemical damage to sidewalls of said MTJ stack and wherein after said first etching, a first layer of conductive metal re-deposition is formed on said sidewalls of said top electrode.

14. The method according to claim 10 wherein there is no chemical damage to sidewalls of said MTJ stack and wherein after each said second and third etching, a subsequent layer of conductive metal re-deposition is formed on said first or subsequent spacers and wherein there is no contact between any of said first layer of conductive metal re-deposition and said subsequent layers of conductive metal re-deposition as they are separated by said first and said subsequent spacers.

15. The method according to claim 10 wherein said depositing said first or subsequent spacer layer comprises depositing a dielectric material having low ion sputter yield comprising SiN, carbon, TaC, or metal oxide in-situ or ex-situ by chemical vapor deposition (CVD), physical vapor deposition (PVD), or atomic layer deposition (ALD) to a thickness of 5-30 nm.

16. The method according to claim 10 wherein an etch rate of said spacers is ≤⅕ an etch rate of said free layer or any of said next layers.

17. The method according to claim 10 further comprising:

covering said MTJ structure with a dielectric layer;

flattening said dielectric layer by chemical mechanical polishing (CMP) to expose said top electrode layer; and forming a top metal contact to said top electrode layer.

18. A magnetic tunneling junction (MTJ) structure comprising:

a least a pinned layer on a bottom electrode;

a barrier layer and first sidewall spacers on said pinned layer;

a free layer and second sidewall spacers on said barrier layer;

a metal hard mask and third sidewall spacers on said free layer; and a top electrode over said free layer wherein any first metal re-deposition on sidewalls of said pinned layer is separated from any second metal re-deposition on sidewalls of said barrier layer by said first sidewall spacers, said second metal re-deposition is separated from any third metal re-deposition on sidewalls of said free layer by said second sidewall spacers, and said third metal re-deposition is separated from any fourth metal re-deposition on sidewalls of said metal hard mask layer by said third sidewall spacers.

* * * * *